(12) United States Patent
Nagarajan et al.

(10) Patent No.: US 8,030,985 B2
(45) Date of Patent: *Oct. 4, 2011

(54) SYSTEM AND METHOD FOR COMPENSATING PULSE GENERATOR FOR PROCESS AND TEMPERATURE VARIATIONS

(75) Inventors: Karthik Nagarajan, Santa Clara, CA (US); Mustafa Ertugrul Oner, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/904,977

(22) Filed: Oct. 14, 2010

(65) Prior Publication Data

US 2011/0025395 A1    Feb. 3, 2011

Related U.S. Application Data

(63) Continuation of application No. 12/487,935, filed on Jun. 19, 2009, now Pat. No. 7,816,967.

(51) Int. Cl.
    *H03K 3/00*    (2006.01)
(52) U.S. Cl. ........................................ 327/291; 327/512
(58) Field of Classification Search ........................ None
     See application file for complete search history.

(56) References Cited

U.S. PATENT DOCUMENTS

| 5,592,111 | A | 1/1997 | Wong |
| 5,604,467 | A | 2/1997 | Matthews |
| 5,912,593 | A * | 6/1999 | Susak et al. .................... 331/111 |
| 5,926,042 | A | 7/1999 | Talaga, Jr. |
| 6,924,709 | B2 * | 8/2005 | Bashar .......................... 331/143 |
| 7,413,342 | B2 | 8/2008 | Mukherjee |
| 7,443,226 | B1 | 10/2008 | Holloway |
| 2008/0238518 | A1 | 10/2008 | Guo et al. |

* cited by examiner

*Primary Examiner* — An Luu

(74) *Attorney, Agent, or Firm* — North Weber & Baugh LLP

(57) ABSTRACT

An apparatus for generating a pulse having a pulse width substantially independent of process variation in resistive and capacitive values. The apparatus includes a PTAT current source to generate a first current to charge a capacitor to produce a first voltage; a ΔVGS current source to generate a second current through a resistor to produce a second voltage V2; a comparator to generate the pulse in response to the first and second voltages; and a circuit to enable the charging and discharging of the capacitor. The use of the distinct current sources (e.g., PTAT and ΔVGS) enables the pulse generator to be configured substantially process independent of resistive value. The use of a MOSFET capacitor for the capacitor enables the pulse generator to be made substantially process independent of capacitive value. An additional bandgap current source in parallel with the ΔVGS current source reduces the pulse width dependency on temperature.

22 Claims, 3 Drawing Sheets

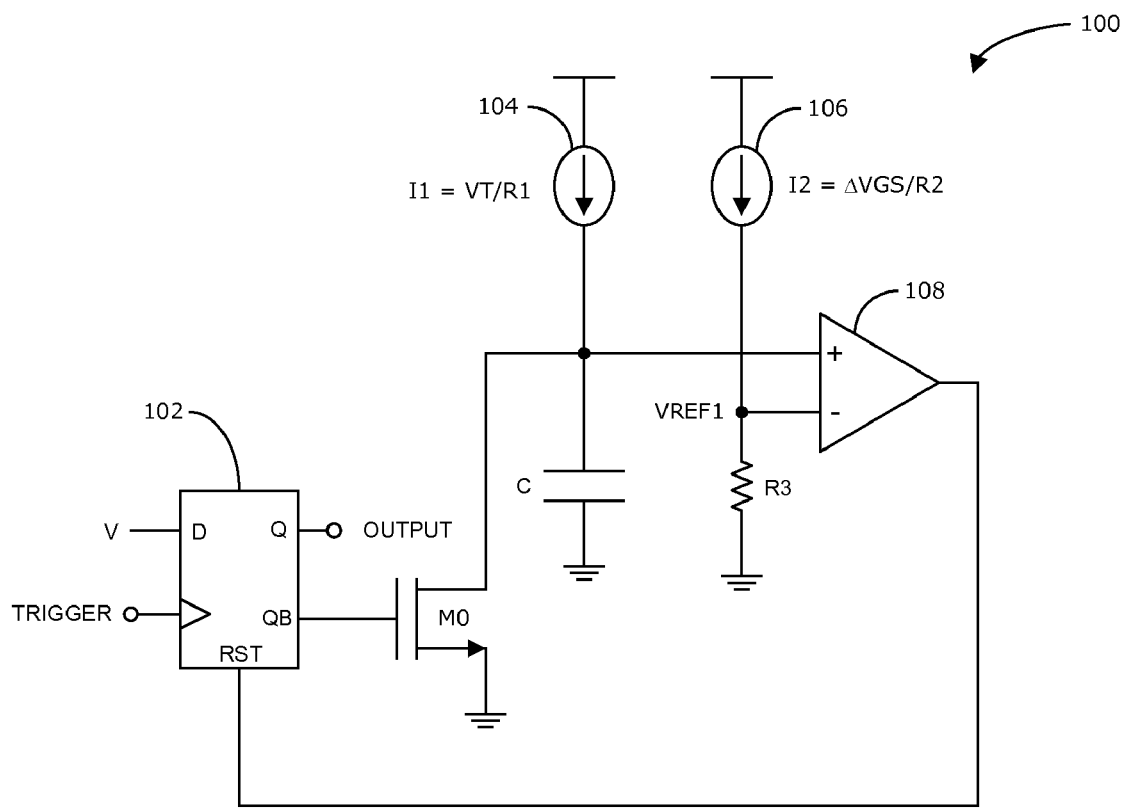
FIG. 1
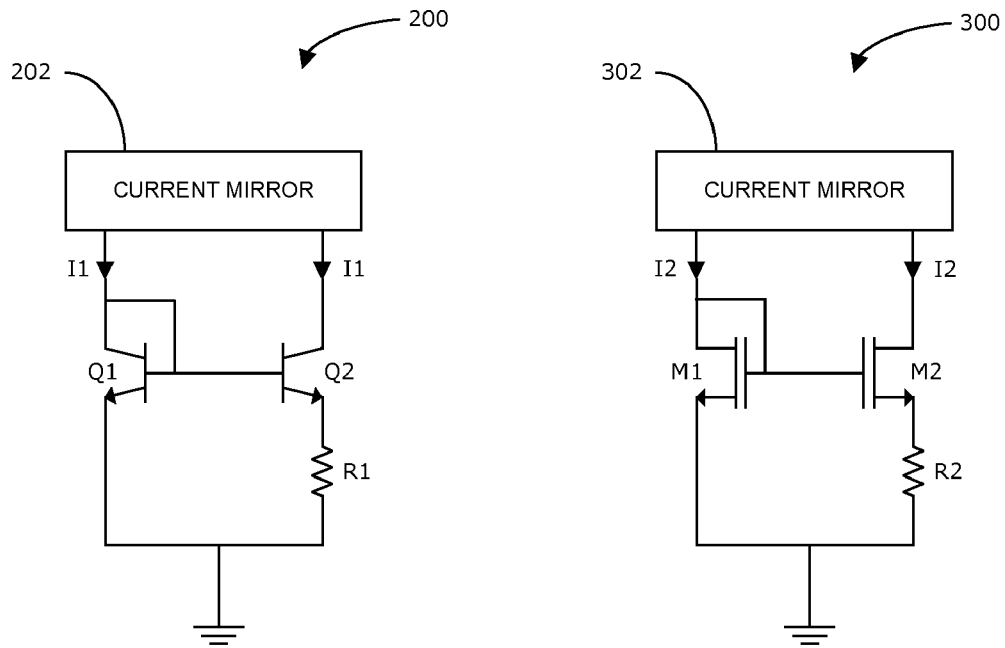
FIG. 2
FIG. 3

US 8,030,985 B2

SYSTEM AND METHOD FOR COMPENSATING PULSE GENERATOR FOR PROCESS AND TEMPERATURE VARIATIONS

CROSS REFERENCE TO RELATED APPLICATIONS

This application is a continuation of U.S. patent application Ser. No. 12/487,935, filed on Jun. 19, 2009, now U.S. Pat. No. 7,816,967 and entitled "SYSTEM AND METHOD FOR COMPENSATING PULSE GENERATOR FOR PROCESS AND TEMPERATURE VARIATIONS." The above-referenced application is herein incorporated by reference.

FIELD

This disclosure relates generally to pulse generators, and in particular, to a system and method for compensating a pulse generator for process and temperature variations. This can be extended to clock generators.

BACKGROUND

In many applications, video data from a video source, such as a camera, is sent to a video processing device, such as a digital television, in a serial manner. Often, the video source employs a parallel-to-serial converter (also referred to as a "serializer") that receives parallel video data and converts it to serial video data. The video source then sends the serial video data to the video processing device via a serial link, which may be configured as a low voltage differential signal (LVDS) link. The video processing device, in turn, employs a serial-to-parallel converter (also referred to as a "deserializer") to convert the received serial video data into parallel video data. The video processing device may then process the parallel video data to generate an image on a display.

In addition to video data, other types of serial data may be communicated between the video source and the video processing device. For example, the video source may send control data to the video processing device for controlling one or more aspects of the processing of the video data. Additionally, the video processing device may send status or informational data to the video source for use by the latter in performing any of a number of functions. Such data may be transmitted asynchronously in compliance with the universal asynchronous receive/transmit (UART).

Because the video processing device receives both video data and UART data, the video processing device needs to differentiate the video data from the UART data. Typically, the video processing device differentiates the two types of data by their respective frequencies or equivalently by the duration of the pulse or the bit time. For example, video data may be sent with a frequency as low as 15 Mbs. Whereas, UART data may be sent with a frequency of 10 Mbs in order for the UART data to be sent within a video blanking interval. A pulse generator is typically used to transmit the UART data.

However, because of variations in the process of manufacturing integrated circuits, the UART data rate achieved by a pulse generator may vary from 10 to 22 Mbs. In such a case, the rate of the video data has to be at minimum 22 Mbs plus a guard band or margin in order for the video processing device to differentiate between the video data from the UART data. Thus, in such a case, low video data rates, such as 15 Mbs may not be possible. Or, conversely, if low video data rates are required, the UART data rates would have to be significantly decreased, which may result in potential loss of UART data because the required data may not be able to be sent within the video blanking interval.

Thus, in order to accommodate high UART data rates and low video data rates, there is a need to reduce variation in the UART pulse duration by using an improved pulse generator that is more process independent.

SUMMARY

An aspect of the disclosure relates to an apparatus for generating a pulse having a pulse width/duration that is substantially independent of changes in resistor and capacitor values caused by process variation. In particular, the apparatus comprises a first current reference source adapted to generate a first current I1 to charge a capacitive element to produce a first voltage V1; a second current reference source adapted to generate a second current through a resistive element to produce a second voltage V2; a comparator adapted to generate the pulse having edges substantially coincidental with the first voltage rising above and falling below the second voltage, respectively; and a trigger circuit adapted to enable the charging of the capacitive element by the first current, and to enable the discharging of the capacitive element.

As discussed in more detail below, the pulse width of the pulse generated by the apparatus may be made substantially independent of resistor values by configuring the first current reference source as a proportional to absolute temperature (PTAT) current reference source, and the second current reference source as a $\Delta$VGS current reference source. In addition, the pulse width of the pulse generated by the apparatus may be made substantially independent of capacitor value by configuring the capacitive element as a MOSFET capacitor. The pulse generating apparatus may further include a bandgap current reference adapted to generate a third current to be combined with the second current to reduce the pulse width dependency on the environment temperature.

Other aspects, advantages and novel features of the present disclosure will become apparent from the following detailed description of the invention when considered in conjunction with the accompanying drawings.

BRIEF DESCRIPTION OF THE DRAWINGS

FIG. 1 illustrates a schematic diagram of an exemplary pulse generator in accordance with an aspect of the disclosure.

FIG. 2 illustrates a schematic diagram of an exemplary current source in accordance with another aspect of the disclosure.

FIG. 3 illustrates a schematic diagram of another exemplary current source in accordance with another aspect of the disclosure.

DETAILED DESCRIPTION OF THE EXEMPLARY EMBODIMENTS

Figure 4:
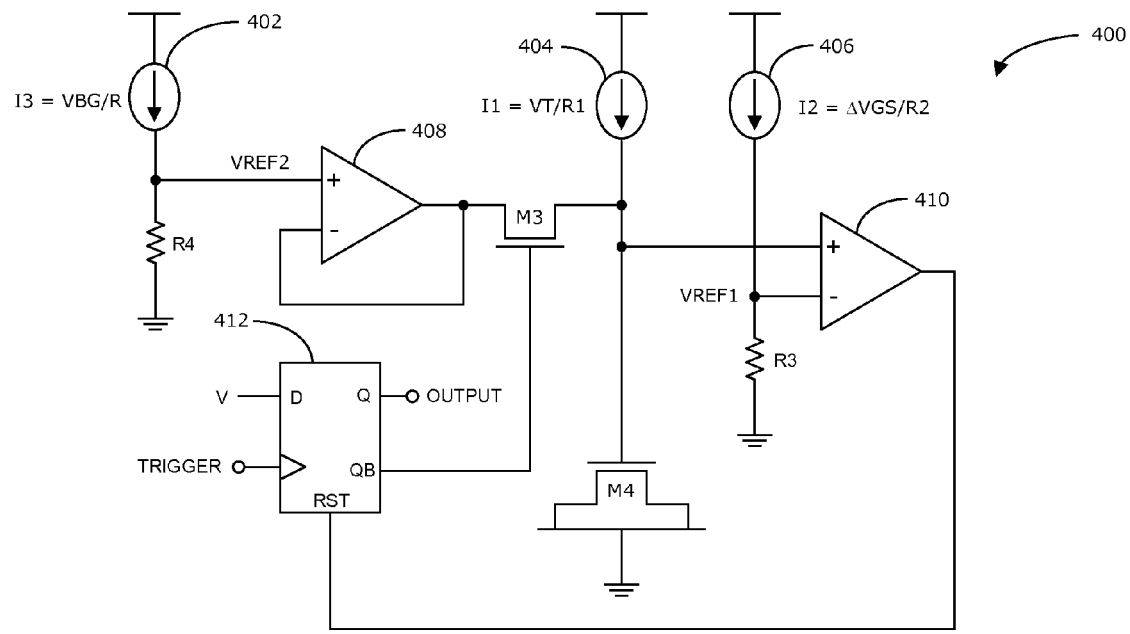
FIG. 4 illustrates a schematic diagram of another exemplary pulse generator in accordance with another aspect of the disclosure.

FIG. 1 illustrates a schematic diagram of an exemplary pulse generator 100 in accordance with an aspect of the disclosure. In summary, the pulse generator 100 is configured to generate a pulse having a width or duration substantially independent of value of resistors. This makes the pulse generator 100 more process independent.

In particular, the pulse generator 100 comprises a flip-flop 102, a transistor M0 (e.g., a metal oxide semiconductor field effect transistor (MOSFET)) used as a switch, a first current source 104, a second current source 106, a capacitor C, a resistor R3, and a comparator 108. The flip-flop 102 includes a data input to receive a logic high voltage V, a clock input to receive a trigger, a QB output to control the switch MOSFET M0, and a Q output to generate the pulse. The MOSFET M0, in turn, includes a source electrically coupled to ground, and a drain electrically coupled to a positive terminal of the comparator 108.

The first current source 104 is coupled between a supply voltage rail (e.g., Vcc) and the positive terminal of the comparator 108. The capacitor C is coupled between the positive terminal of the comparator 108 and ground. The second current source 106 is coupled between the supply voltage rail (e.g., Vcc) and the negative terminal of the comparator 108. The resistor R3 is coupled between the negative terminal of the comparator 108 and ground. The output of the comparator 108 is electrically coupled to the reset input (RST) of the flip-flop 102.

In operation, when a triggering edge arrives at the clock input of the flip-flop 102, the Q output of the flip-flop transitions from a low logic level to a high logic level, to produce the leading edge of the pulse. Additionally, the QB output of the flip-flop 102 transitions from a high logic level to a low logic level. This causes the MOSFET M0 to turn off, allowing the first current source 104 to charge the capacitor C with a current I1, to produce a rising voltage at the positive terminal of the comparator 108. The second current source 106 generates a current I2 that produces a reference voltage VREF1 across the resistor R3, and at the negative terminal of the comparator 108. When the voltage at the positive input of the comparator 108 rises above the reference voltage VREF1, the output of the comparator 108 transitions from a low logic level to a high logic level.

The high logic level then causes the flip-flop 102 to reset, thereby causing the Q output of the flip-flop to transition from the high logic level to the low logic level, to produce the trailing edge of the pulse. Additionally, the QB output of the flip-flop 102 transitions from the low logic level to the high logic level. The high logic level at the QB output causes the MOSFET M0 to turn on, thereby discharging the capacitor C. When the voltage across the capacitor decreases below the reference voltage VREF1, the output of the comparator 108 transitions from the high logic level to the low logic level. The pulse width or duration is then dictated by the time interval between the rising edge and the falling edge of the Q-output of the flip-flop 102.

In general, the pulse width is related to the time required to charge the capacitor C to the reference voltage VREF1. Accordingly, the time $T_P$ to charge the capacitor C may be determined using the following equation:

$$T_P = C * VREF1/I1 \qquad \text{Eq. 1}$$

In the exemplary embodiment, the first current source 104 may be configured as a proportional to absolute temperature (PTAT) current reference 200 as shown in FIG. 2 or variation thereof. The PTAT current reference 200 comprises a current minor 202, a first bipolar junction transistor (BJT) Q1, a second BJT Q2, and a resistor R1. The emitter of BJT Q1 is electrically coupled to ground. The collector terminals may be connected to a current minor 202 or any circuit that will maintain substantially equal currents in Q1 and Q2. And, resistor R1 is electrically coupled between the emitter of the BJT Q2 and ground. The first current source 104 (as well as PTAT current source 200) produces a current I1 which may be given by the following equation:

$$I1 = V_T * \ln(N)/R1 \qquad \text{Eq. 2}$$

where $V_T$ is the thermal voltage, N is related to the ratio of the junction area of BJT Q2 to the junction area of BJT Q1, and R1 is the resistance of resistor R1.

In the exemplary embodiment, the second current source 106 may be configured as a ΔVGS current reference 300 as shown in FIG. 3 or variation thereof. The ΔVGS current reference 300 comprises a current mirror 302, a first MOSFET M1, a second MOSFET M2, and a resistor R2. The drains and gates of MOSFETs M1 and M2 may be connected to the current minor 202 or any circuit that will maintain substantially equal currents in M1 and M2. The source of MOSFET M1 is electrically coupled to ground. And, resistor R2 is electrically coupled between the source of MOSFET M2 and ground. The second current source 106 (as well as ΔVGS current source 300) produces a current I2 which may be given by the following equation:

$$I2 = \frac{2 * \left(\sqrt{(L1)} - \sqrt{(L2)}\right)^2}{\mu * Cox * W * R2 * R2} \qquad \text{Eq. 3}$$

where L1 is the channel length of MOSFET M1, L2 is the channel length of MOSFET M2, μ is the mobility of the channel carriers of MOSFETs M1 and M2, Cox is the gate capacitance of MOSFETs M1 and M2, W is the width of the channel of MOSFETs M1 and M2, and R2 is the resistance of resistor R2.

The reference voltage VREF1 may be determined using the following equation:

$$VREF1 = I2 * R3 \qquad \text{Eq. 4}$$

Substituting I2 given by Eq. 3 into I2 of Eq. 4, the reference voltage VREF1 may be given by the following equation:

$$VREF1 = \frac{2 * \left(\sqrt{(L1)} - \sqrt{(L2)}\right)^2 * R3}{\mu * Cox * W * R2 * R2} \qquad \text{Eq. 5}$$

The ratio of resistances R3/R2 may be replaced by a constant $K_2$, and Eq. 5 may be rewritten to show that VREF1 varies inversely with value of resistance R2:

$$VREF1 = \frac{2 * \left(\sqrt{(L1)} - \sqrt{(L2)}\right)^2 * K_2}{\mu * Cox * W * R2} \qquad \text{Eq. 6}$$

Substituting I1 given by Eq. 2 into I1 of Eq. 1, and substituting VREF1 of Eq. 6 into VREF1 of Eq. 1, the pulse width $T_P$ may be given by the following equation:

$$T_P = \frac{C * 2 * \left(\sqrt{(L1)} - \sqrt{(L2)}\right)^2 * K_2 * R1}{\mu * Cox * W * R2 * V_T * \ln(N)} \qquad \text{Eq. 7}$$

Since both the numerator and the denominator vary with value of resistances in the same manner, the pulse width $T_P$ depends only on the ratio of two resistances, and not on their actual values. Thus, by employing a PTAT current reference for the first current source 104, and a ΔVGS current reference for the second current source 106, the pulse width of the pulses generated by the pulse generator 100 may be made substantially independent of variation in values of the resistors R1, R2, and R3. The pulse width TP may then be rewritten in terms of the ratio of resistances as:

$$T_p = \frac{C*2*(\sqrt{(L1)} - \sqrt{(L2)})^2 * K_1}{\mu * Cox * W * V_T * \ln(N)};$$ Eq. 8 where $K_1 = K_2 * R1/R2$

FIG. 4 illustrates a schematic diagram of another exemplary pulse generator 400 in accordance with another aspect of the disclosure. In the previous embodiment 100, the pulse width $T_P$ is substantially independent of process variation regarding the resistors R1, R2, and R3, but still dependent on the capacitance of capacitor C as indicated by Eq. 8. In this embodiment 400, the use of a MOSFET capacitor in place of a standard capacitor removes the dependency of the pulse width $T_P$ with process variation in the capacitance of the MOSFET capacitor, as explained in detail below.

In particular, the pulse generator 400 comprises a flip-flop 412, a MOSFET M3 (used as a switch), a first current source 404, a second current source 406, a MOSFET capacitor M4, a resistor R3, a comparator 410, a third current source 402, a resistor R4, and a voltage-follower or buffer 408. The flip-flop 412 includes a data input to receive a logic high voltage V, a clock input to receive a trigger, a QB output coupled to a gate of the MOSFET M3, and a Q output adapted to produce the pulse. The MOSFET M3, in turn, includes a source electrically coupled to an output of the voltage-follower 408, and a drain electrically coupled to a positive terminal of the comparator 410.

The first current source 404 is coupled between a supply voltage rail (e.g., Vcc) and the positive terminal of the comparator 410. The MOSFET capacitor M4 includes a gate electrically coupled to the positive terminal of the comparator 410, and drain and source electrically coupled to ground. The second current source 406 is coupled between the supply voltage rail (e.g., Vcc) and the negative terminal of the comparator 410. The resistor R3 is coupled between the negative terminal of the comparator 410 and ground. The output of the comparator 410 is electrically coupled to the reset input (RST) of the flip-flop 102.

The third current source 402 is coupled between the supply voltage rail (e.g., Vcc) and the positive terminal of the voltage-follower 408. The resistor R4 is coupled between the positive terminal of the voltage-follower 408 and ground. And, the negative terminal is coupled to the output of the voltage-follower 408.

In operation, when a triggering edge arrives at the clock input of the flip-flop 412, the Q output of the flip-flop transitions from a low logic level to a high logic level, to produce the leading edge of the pulse. Additionally, the QB output transitions from a high logic level to a low logic level. This causes the MOSFET M3 to turn off, allowing the first current source 404 to charge the MOSFET capacitor M4 with the current I1. The second current source 406 generates a current I2 that produces a reference voltage VREF1 across the resistor R3. When the voltage on the gate of the MOSFET capacitor M4 rises above the reference voltage VREF1, the output of the comparator 410 transitions from a low logic level to a high logic level.

The high logic level then causes the flip-flop 412 to reset, thereby causing the Q output of the flip-flop to transition from the high logic level to the low logic level, to produce the trailing edge of the pulse. Additionally, the QB output of the flip-flop 412 transitions from a low logic level to a high logic level. The high logic level at the QB output causes the MOSFET M3 to turn on, thereby coupling the output of the voltage-follower 408 to the MOSFET capacitor M4. The third current source 402 generates a bandgap reference current I3 (e.g., I3=VBG/R), which produces a reference voltage VREF2 across the resistor R4. The voltage-follower 408 produces the reference voltage VREF2 at its output. The reference voltage VREF2 is chosen to be greater than the threshold voltage of the MOSFET capacitor M4, but lower than the first reference voltage VREF1.

Thus, the turning on the MOSFET M3 causes the discharging of the MOSFET capacitor M4 through the output of the voltage-follower 408. When the voltage at the gate of the MOSFET capacitor M4 decreases below the reference voltage VREF1, the output of the comparator 410 transitions from a high logic level to a low logic level. The pulse width is then dictated by the time interval between the rising edge and the falling edge of the Q-output of the flip-flop 412. The pulse width is related to the time of charging the MOSFET capacitor M4, which is given basically by Eq. 6, except the capacitance of capacitor C needs to be modified for the MOSFET capacitor M4.

The capacitance of the MOSFET capacitor M4 may be given by the following equation:

$$C = M * Cox$$ Eq. 9 where the Cox is the capacitance density of the gate oxide of the MOSFET capacitor M4, and M is the effective channel area under the gate of the MOSFET capacitor M4. Substituting the C in Eq. 9 into C of Eq. 8, the pulse width $T_P$ of the pulses generated by the pulse generator 400 may be given by the following:

$$T_p = \frac{M * Cox * 2 * (\sqrt{(L1)} - \sqrt{(L2)})^2 * K_1}{\mu * Cox * W * V_T * \ln(N)}$$ Eq. 10

By using the same technology for the MOSFETs of the current source 406 and the MOSFET capacitor M4, the gate oxide capacitance density Cox in the numerator cancels with the gate oxide capacitance density Cox in the denominator of Eq. 10. Thus, the pulse width $T_P$ of the pulses generated by the pulse generator 400 may be given by the following equation:

$$T_p = \frac{M * 2 * (\sqrt{(L1)} - \sqrt{(L2)})^2 * K_1}{\mu * W * V_T * \ln(N)}$$ Eq. 11

Thus, by using a MOSFET capacitor M4, the pulse width $T_P$ can be made substantially process independent of actual value of both resistors and capacitors, and any variations in the actual values.

Figure 5:
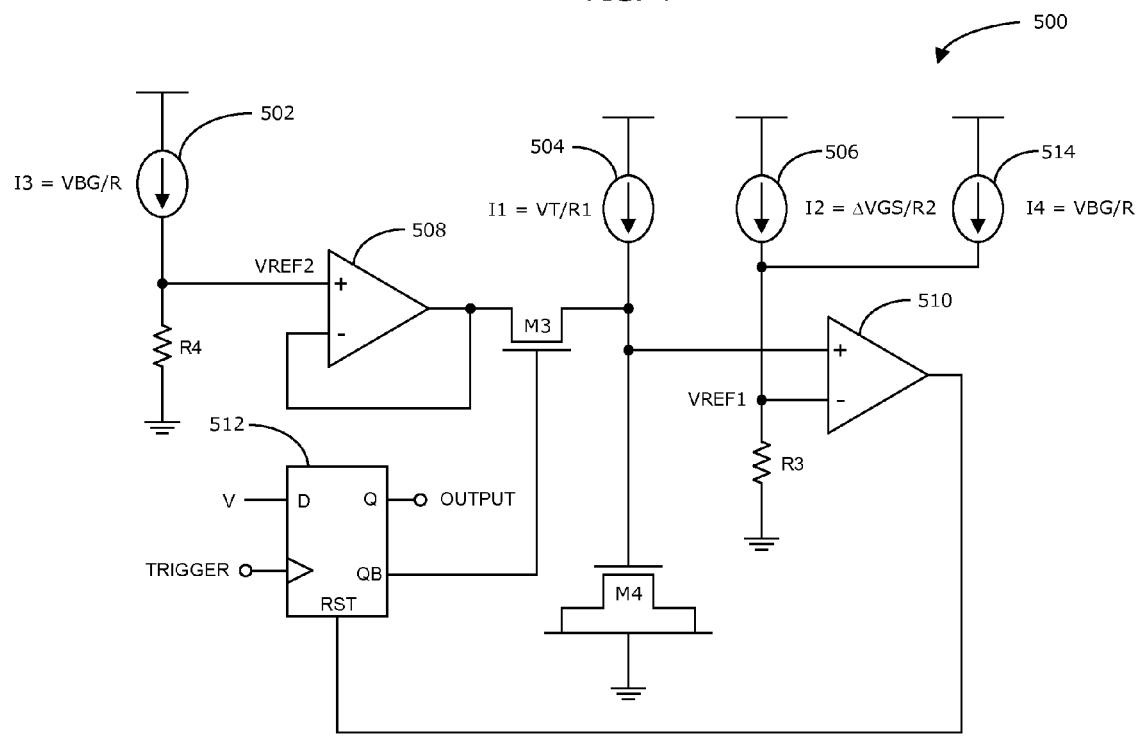
FIG. 5 illustrates a schematic diagram of yet another exemplary pulse generator in accordance with another aspect of the disclosure.

FIG. 5 illustrates a schematic diagram of yet another exemplary pulse generator 500 in accordance with another aspect of the disclosure. In the previous embodiment 400, the pulse width $T_P$ is substantially independent of process variation of the resistors and capacitors, but still dependent on environment temperature. In this embodiment 500, an additional bandgap current reference is added to reduce the pulse width's dependency on temperature.

In particular, the pulse generator 500 is similar to that of the previous embodiment 400, except for the added bandgap current reference. More specifically, the pulse generator 500 comprises a flip-flop 512, a MOSFET M3, a first current source 504, a second current source 506, a MOSFET capacitor M4, a resistor R3, a comparator 510, a third current source 502, a resistor R4, and a voltage-follower or buffer 508. In addition to these elements, the pulse generator 500 comprises a bandgap current reference 514 situated between the power supply rail (e.g., Vcc) and the negative terminal of the comparator 510.

According to Eq. 11, the pulse width $T_P$ is still temperature dependent because both the mobility μ of the channel carriers of the MOSFET of the second current source 506 and the thermal voltage $V_T$ of the BJT of the first current source 504 are temperature dependent. For instance, the mobility μ is related to temperature in accordance with the following equation:

$$\mu = \mu_{tr} * \left(\frac{T}{T_r}\right)^{-k3} \quad \text{Eq. 12}$$

where $T_r$ is the room temperature in Kelvin, T is the current environment temperature, $\mu_{tr}$ is the mobility at room temperature, and k3 denotes how the mobility varies with temperature. For example, the value of k3 may be between 1.5 to 2.0. The thermal voltage $V_T$ may be given by the following equation:

$$V_T = k_b * T/q \quad \text{Eq. 13}$$

where T is the current environment temperature in Kelvin and $k_b$ is the Boltzman constant. Thus, $V_T$ is directly proportional to temperature.

Accordingly, combining both Eqs. 12 and 13, the temperature-dependent variables $\mu * V_T$ of Eq. 11 may be given by the following equation:

$$\mu * V_T = \frac{k_b * \mu_{tr} * (T)^{1-k3} * (T_r)^{k3}}{q} \quad \text{Eq. 14}$$

If all of the temperature independent terms in Eq. 14 are replaced with the constant S, then Eq. 14 may be rewritten as follows:

$$\mu * V_T = S * (T)^{1-k3} \text{(where } S = k_b * \mu_{tr} * (T_r)^{k3}/q) \quad \text{Eq. 15}$$

Substituting Eq. 15 into Eq. 11, the pulse width $T_P$ may be given by the following equation:

$$T_P = \frac{M * 2 * \left(\sqrt{(L1)} - \sqrt{(L2)}\right)^2 * R3 * R1 * (T)^{k3-1}}{S * W * R2 * R2 * \ln(N)} \quad \text{Eq. 16}$$

Since as discussed above k3 is greater than 1, then according to Eq. 16, the pulse width increases with the environment temperature.

To overcome this variation with temperature, an additional term, which varies inversely with temperature, can be added to the pulse width $T_P$. This can be achieved by adding an extra current source, derived from the bandgap voltage, to the current I2 as shown in FIG. 5. The total current that sets VREF1 is given by:

$$I2 + I4 = \frac{2 * \left(\sqrt{(L1)} - \sqrt{(L2)}\right)^2}{\mu * Cox * W * R2 * R2} + \frac{VBG}{R} \quad \text{Eq. 17}$$

The value of VREF1 would then be:

$$VREF1 = \frac{2 * \left(\sqrt{(L1)} - \sqrt{(L2)}\right)^2 * R3}{\mu * Cox * W * R2 * R2} + \frac{VBG * R3}{R} \quad \text{Eq. 18}$$

The expression for the pulse width $T_P$ with this extra current added may be given by:

$$T_P = \frac{M_1 * 2 * \left(\sqrt{(L1)} - \sqrt{(L2)}\right)^2 * (T)^{k3-1}}{W * \ln(N)} + \frac{VBG * R1 * Cox * M_2}{T * \ln(N)} \quad \text{Eq. 19}$$

Where, $M_1$ and $M_2$ replaces the constant terms in the expression.

Figure 6:
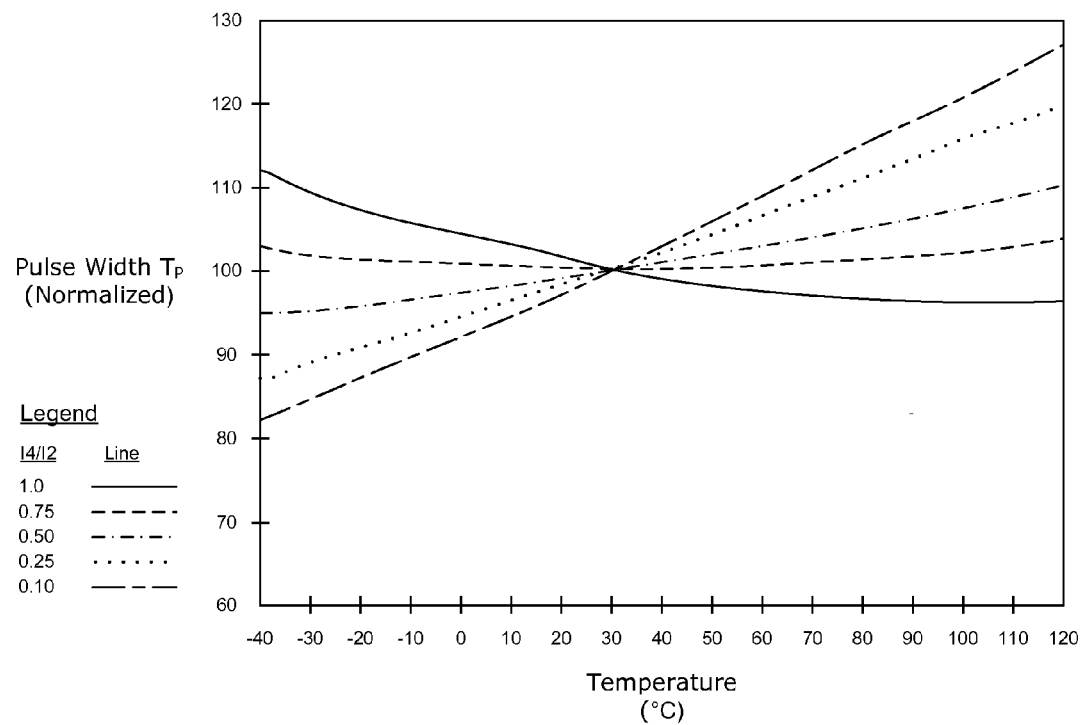
FIG. 6 illustrates an exemplary graph of the variation of the pulse width $T_P$ with temperature.

According to Eq. 19, the expression for $T_P$ contains two terms: the first term is independent of most process parameters but will increase with temperature, and the second term is sensitive to variations in R1 and Cox but will decrease with temperature. While compensating for temperature variations in $T_P$, the extra term has compromised some process invariance. FIG. 6 illustrates an exemplary graph of the variation of the pulse width $T_P$ with temperature for different ratios of I4 to I2.

The amount of temperature compensating current—I4, that needs to be added, depends on value of K3 (which shows the variation of mobility with temperature), operational temperature range for the circuit, and the amount of process variations in R and Cox. For these given values, it is possible to choose an optimal ratio of I4 to I2 that gives the best compromise between temperature and process variations in pulse width $T_P$. Thus, achieving a pulse width that has the least variation covering all temperature range and process variations. As an example, when K3=1 and for the temperature range −40 C to 120 C, the graph shows variation of pulse width across temperature for different ratios of I4/I2 (e.g., 1.0, 0.75, 0.50, 0.25, and 0.10). In the chosen process, with the given variations in R and Cox, the ratio I4/I2=0.4 resulted in a pulse width that has an overall min-max variation of 24%. If the current I2 was made zero, as will be the case in a typical pulse/delay generators, this variation would be close to 120% for the same temperature range and process variations. This invention can result in 5× reduction in the overall variation in pulse width/duration.

In addition, if the resistor R4 is relatively small, the voltage-follower 408 or 508 may be eliminated. Although, as discussed in the Background section, the impetus for the pulse generators described herein had to do with controlling the sending of control and information data between a video source and a video processing device, it shall be understood that the pulse generators may be employed in any application.

Figure 7:
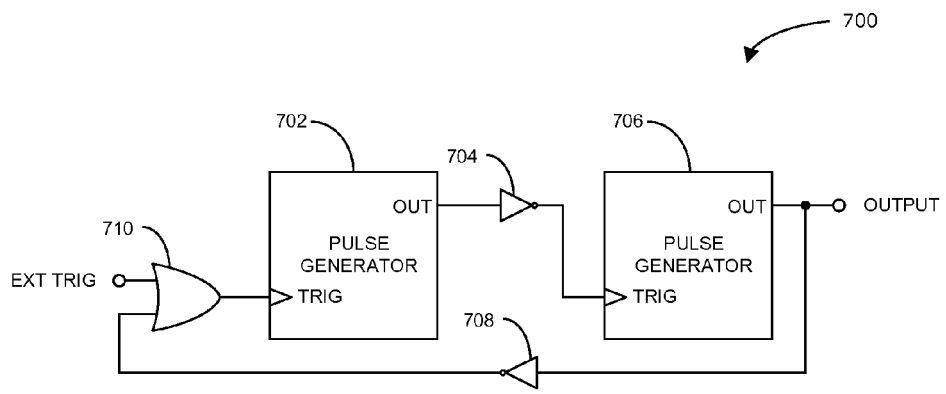
FIG. 7 illustrates a block diagram of an exemplary clock generator in accordance with another aspect of the disclosure.

FIG. 7 illustrates a block diagram of an exemplary clock generator 700 in accordance with another aspect of the disclosure. The concepts described herein can also be extended for use in clock generators. As an example, the clock generator 700 comprises a first pulse generator 702, a first inverter 704, a second pulse generator 706, a second inverter 708, and an OR-gate 710. The OR-gate 710 includes a first input to receive an external trigger signal for initiating the generation of the clock signal at the output of the second pulse generator 706. The OR-gate 710 further includes a second input coupled to an output of the second inverter 708. The OR-gate 710 includes an output coupled to a trigger input of the first pulse generator 702. The output of the first pulse generator 702 is coupled to an input of the first inverter 704. The output of the first inverter 704 is coupled to the trigger input of the second pulse generator 706. The output of the second pulse generator 706 is coupled to an input of the inverter 708.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for generating a pulse, comprising:
   a first current source adapted to generate a first current I1 to charge a capacitive element to produce a first voltage V1;
   a second current source adapted to generate a second current I2 through a first resistive element to produce a second voltage V2;
   a comparator adapted to initiate or generate the pulse in response to the first and second voltages; and
   a trigger circuit adapted to:
      enable the charging of the capacitive element by the first current; and
      enable the discharging of the capacitive element.

2. The apparatus of claim 1, wherein the first current source is a proportional to absolute temperature (PTAT) current reference source.

3. The apparatus of claim 1, wherein the first current I1 is given substantially by the following equation:

$$I1 = V_T * \ln(N)/R1$$

where $V_T$ is a thermal voltage of first and second bipolar junction transistors (BJTs) of a PTAT current reference source, N is related to a ratio of a first junction area of the first BJT to a second junction area of the second BJT, and R1 is a resistance of a second resistive element of the PTAT current reference source.

4. The apparatus of claim 1, wherein the second current source is a ΔVGS current reference source.

5. The apparatus of claim 1, wherein the second current I2 is given substantially by the following equation:

$$I2 = \frac{2*(\sqrt{(L1)} - \sqrt{(L2)})^2}{\mu C_{ox} * W * R2 * R2}$$

where L1 is a first length of a first channel of a first metal oxide semiconductor field effect transistor (MOSFET) of a ΔVGS current reference source, L2 is a second length of a second channel of a second MOSFET of the ΔVGS current reference source, μ is a mobility of carriers of the first and second MOSFETs, Cox is a gate capacitance density of the first and second MOSFETs, W is a width of the first and second channels of the first and second MOSFETs, and R2 is a resistance of a third resistive element of the ΔVGS current reference source.

6. The apparatus of claim 1, wherein a pulse width of the pulse is related to a time Tp given substantially by the following equation:

$$T_P = C * VREF1/I1$$

where C is a capacitance of the capacitive element.

7. The apparatus of claim 1, wherein the capacitive element comprises a MOSFET capacitor.

8. The apparatus of claim 1, wherein a pulse width of the pulse is substantially process independent of actual value of both resistors and capacitors.

9. The apparatus of claim 1, further comprising a third current reference source adapted to generate a third current to be combined with the second current to reduce a width of the pulse dependency on an environment temperature.

10. The apparatus of claim 9, wherein the third current is derived from a bandgap voltage.

11. The apparatus of claim 1, wherein the trigger circuit comprises:
    a flip-flop adapted to generate a signal comprising first and second states; and
    a switching device adapted to:
       enable the charging of the capacitive element in response to the first state;
       enable the discharging of the capacitive element in response to the second state.

12. The apparatus of claim 11, wherein the flip-flop includes a first input adapted to receive a triggering signal for initiating the generation of the first state.

13. The apparatus of claim 11, wherein the flip-flop includes a second input adapted to receive a reset signal for initiating the generation of the second state.

14. The apparatus of claim 11, wherein the flip-flop includes an output adapted to generate the pulse.

15. An apparatus for generating a pulse, comprising:
    a first current reference source adapted to generate a first current to charge a capacitive element to produce a first voltage V1;
    a second current reference source adapted to initiate a second current I2 through a first resistive element R to produce a second voltage V2; and
    a device adapted to generate the pulse in response to the first and second voltages;
    wherein the second current reference source is a ΔVGS current reference source, and the second current I2 is associated with a gate-to-source voltage of a transistor included in the ΔVGS current reference source.

16. The apparatus of claim 15, wherein the capacitive element comprises a MOSFET capacitor.

17. The apparatus of claim 15, wherein the device comprises a comparator.

18. The apparatus of claim 15, wherein the device comprise a flip-flop.

19. The apparatus of claim 15, further comprising a third current source adapted to generate a third current to be combined with the second current to produce the second voltage V2.

20. An apparatus for generating a pulse, comprising:
    a first current reference source adapted to generate a first current to charge a capacitive element to produce a first voltage V1;
    a second current reference source adapted to generate a second current I2 through a first resistive element to produce a second voltage V2; and
    a device adapted to generate the pulse in response to the first and second voltages;
    wherein the second current reference source is a ΔVGS current reference source, and the second current I2 is associated with a gate-to-source voltage of a transistor included in the ΔVGS current reference source.

21. The apparatus of claim 20, further comprising a third current reference source adapted to generate a third current that is combined with the second current to generate the second voltage V2.

22. The apparatus of claim 20, wherein the third current reference source is a bandgap current reference.

* * * * *